(12) United States Patent
Otera

(10) Patent No.: US 10,193,053 B2
(45) Date of Patent: Jan. 29, 2019

(54) INSULATING BASE MATERIAL WITH CONDUCTIVE PATTERN

(71) Applicant: Murata Manufacturing Co., Ltd., Nagaokakyo-shi, Kyoto-fu (JP)

(72) Inventor: Shozo Otera, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 113 days.

(21) Appl. No.: 15/296,124

(22) Filed: Oct. 18, 2016

(65) Prior Publication Data

US 2017/0040526 A1 Feb. 9, 2017

Related U.S. Application Data

(63) Continuation of application No. PCT/JP2015/055592, filed on Feb. 26, 2015.

(30) Foreign Application Priority Data

Apr. 30, 2014 (JP) .................................. 2014-093944

(51) Int. Cl.
| | |
|---|---|
| *H01L 41/09* | (2006.01) |
| *H01L 41/047* | (2006.01) |
| *H01L 41/193* | (2006.01) |
| *H02N 2/00* | (2006.01) |
| *H02N 2/02* | (2006.01) |

(52) U.S. Cl.
CPC ............ *H01L 41/09* (2013.01); *H01L 41/047* (2013.01); *H01L 41/0477* (2013.01); *H01L 41/193* (2013.01); *H02N 2/00* (2013.01); *H02N 2/02* (2013.01)

(58) Field of Classification Search
CPC ...................................................... H01L 41/193
See application file for complete search history.

(56) References Cited

U.S. PATENT DOCUMENTS

| | | | | |
|---|---|---|---|---|
| 4,127,681 A | * | 11/1978 | Ferren ...................... | H01G 7/02 252/500 |
| 7,034,432 B1 | * | 4/2006 | Pelrine .................... | F02G 1/043 310/309 |
| 8,314,536 B2 | * | 11/2012 | Ito ............................ | G01L 1/16 310/365 |
| 9,589,697 B2 | * | 3/2017 | Otera ....................... | C08L 25/18 |
| 2002/0050769 A1 | | 5/2002 | Pelrine et al. | |

(Continued)

FOREIGN PATENT DOCUMENTS

| | | |
|---|---|---|
| JP | 2003-506858 A | 2/2003 |
| JP | 2009-55700 A | 3/2009 |

(Continued)

OTHER PUBLICATIONS

Official Communication issued in corresponding International Application PCT/JP2015/055592, dated Apr. 21, 2015.

*Primary Examiner* — J. San Martin
(74) *Attorney, Agent, or Firm* — Keating & Bennett, LLP

(57) ABSTRACT

An insulating base material including conductive patterns includes an insulating base material layer, metal layers provided on the insulating base material layer, and conductive patterns of a conductive material, provided on the metal layers, and an in-plane resistance value of the metal layers is about 0.1 MΩ or more larger than an in-plane resistance value of the conductive patterns.

14 Claims, 2 Drawing Sheets

(56) References Cited

U.S. PATENT DOCUMENTS

| | | | | |
|---|---|---|---|---|
| 2010/0039001 A1* | 2/2010 | Kudoh | ................... | F03G 7/005 |
| | | | | 310/366 |
| 2012/0139393 A1* | 6/2012 | Choi | ................... | H01L 41/0474 |
| | | | | 310/366 |
| 2013/0127299 A1* | 5/2013 | Kim | ...................... | H01L 41/18 |
| | | | | 310/364 |
| 2014/0035735 A1* | 2/2014 | Zellers | ................... | G08B 6/00 |
| | | | | 340/407.2 |
| 2014/0300251 A1* | 10/2014 | Colli | ...................... | H01L 41/25 |
| | | | | 310/339 |
| 2015/0295163 A1* | 10/2015 | Komeda | ................. | H01G 7/02 |
| | | | | 428/212 |
| 2016/0188119 A1* | 6/2016 | Ham | ................... | H01L 41/1132 |
| | | | | 345/175 |
| 2017/0290145 A1* | 10/2017 | Tajima | ................ | H05K 1/0281 |

FOREIGN PATENT DOCUMENTS

| | | |
|---|---|---|
| JP | 2012-125140 A | 6/2012 |
| JP | 5512063 B2 | 6/2014 |
| WO | 01/06579 A2 | 1/2001 |

\* cited by examiner

FIG. 1
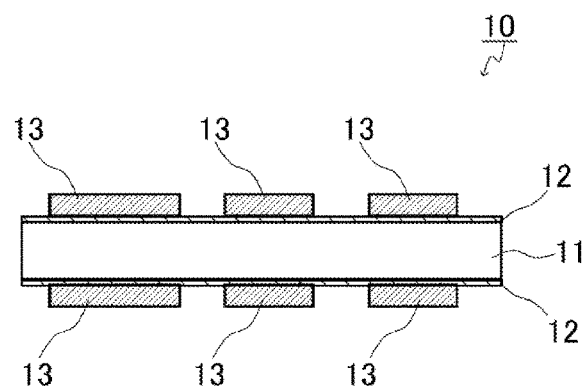
FIG. 2A                    FIG. 2B
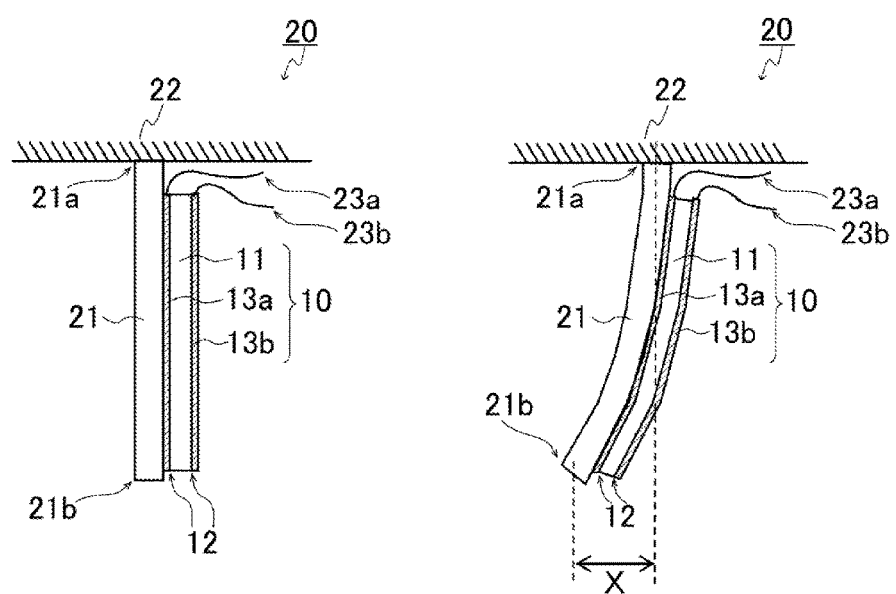

INSULATING BASE MATERIAL WITH CONDUCTIVE PATTERN

CROSS REFERENCE TO RELATED APPLICATIONS

This application claims the benefit of priority to Japanese Patent Application 2014-093944 filed on Apr. 30, 2014, and is a Continuation Application of PCT/JP2015/055592 filed on Feb. 26, 2015. The entire contents of each application are hereby incorporated herein by reference.

BACKGROUND OF THE INVENTION

1. Field of the Invention

The present invention relates to an insulating base material including a conductive pattern provided thereon, which can be used as an electrode and for other suitable purposes.

2. Description of the Related Art

In recent years, various members of insulating polymer sheets with electrodes provided thereon have been studied, such as polymer actuators and members for touch panels. The polymer actuator includes an insulating film with electrodes of conductive films provided on both sides of the insulating film, to convert electrical energy to kinetic energy through the application of a voltage between the electrodes. Specifically, the application of a voltage between the electrodes provided on the both sides of the insulating film causes an attraction by Coulomb's force to occur between the electrodes, so that the insulating film is pressed in a thickness direction so as to be extended (for example, see Japanese Patent Application Laid-Open No. 2003-506858 and Japanese Patent Application Laid-Open No. 2009-55700).

FIG. 3 is a diagram schematically illustrating the polymer actuator disclosed in Japanese Patent Application Laid-Open No. 2003-506858. The polymer actuator 30 includes structured electrodes 32, 33 on both sides of a polymer 31 defining an insulating film. In this case, the structured electrodes 32 (33) are composed of charge distribution layers 32a (33a) and metal patterns 32b (33b), and the metal patterns 32b (33b) are formed by patterning into parallel lines on the charge distribution layers 32a (33a). The application of a voltage between the metal patterns 32b, 33b causes the layers 32a, 33a, and the polymer 31 to expand/contract. However, the charge distribution layers 32a, 33a extend/contract on the order of several % more than metal patterns 32b, 33b, which causes a problem of peeling of the metal patterns 32b (33b) at the interfaces between the charge distribution layers 32a (33a) and the metal patterns 32b (33b).

FIG. 4 is a diagram schematically illustrating the polymer actuator disclosed in Japanese Patent Application Laid-Open No. 2009-55700. In order to overcome the previously mentioned problem, Japanese Patent Application Laid-Open No. 2009-55700 discloses a polymer actuator 40 including metal patterns 44, 45 disposed on both sides of an insulating elastomer 41, and covered with conductive elastomers 42, 43, as shown in FIG. 4. This configuration attempts to cause the adhesion between the insulating elastomer and the conductive elastomers so as to prevent the metal patterns from being peeled.

However, while the metal patterns are covered with the conductive elastomer according to the technique in Japanese Patent Application Laid-Open No. 2009-55700, the conductive elastomer includes fillers therein, and has a lower conductivity as compared to metals and organic conductive materials, thus causing a problem of an increase in loss. In addition, the metal patterns must be provided, in addition to the conductive elastomers on the insulating elastomer, and the process becomes complicated.

SUMMARY OF THE INVENTION

Preferred embodiments of the present invention provide an insulating base material including a conductive pattern, which has a simple structure, and prevents a conductive material from being peeled.

An insulating base material including a conductive pattern according to a preferred embodiment of the present invention includes an insulating base material layer, a metal layer provided on the insulating base material layer, and a conductive pattern, including a conductive material, provided on the metal layer, and the metal layer has an in-plane resistance value that is at least about 0.1 MΩ larger than an in-plane resistance value of the conductive pattern.

In an insulating base material including the conductive pattern according to a preferred embodiment of the present invention, the difference is preferably about 100 MΩ or less between the in-plane resistance value of the metal layer and an in-plane resistance value of the insulating base material layer.

In an insulating base material including the conductive pattern according to a preferred embodiment of the present invention, the in-plane resistance value of the metal layer preferably falls within the range of about 0.1 MΩ to about 100 MΩ.

In an insulating base material including the conductive pattern according to a preferred embodiment of the present invention, a thickness of the metal layer is preferably about 10 nm or less, for example.

In an insulating base material including the conductive pattern according to a preferred embodiment of the present invention, the insulating base material layer may be an electrostrictive material.

In the insulating base material including the conductive pattern according to a preferred embodiment of the present invention, the metal layer preferably includes a metal selected from the group consisting of aluminum, copper, platinum, gold, nickel, or alloys thereof.

In an insulating base material including the conductive pattern according to a preferred embodiment of the present invention, the conductive material is preferably an organic conductive material.

An actuator according to a preferred embodiment of the present invention includes an insulating base material including the conductive pattern according to a preferred embodiment of the present invention.

According to the various preferred embodiments of present invention, insulating base materials including a conductive pattern may be provided, which has a simple structure, and prevents a conductive material from being peeled. The insulating base materials including the conductive pattern according to various preferred embodiments of the present invention may be used in, for example, an actuator in a preferred manner.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a cross-sectional view of an insulating base material 10 including a conductive pattern according to a preferred embodiment of the present invention.

FIGS. 2A and 2B are diagrams explaining the operation of an actuator using an insulating base material including a conductive pattern according to a preferred embodiment of the present invention, FIG. 2A shows the actuator which is not deformed, whereas FIG. 2B shows the actuator which is deformed.

DETAILED DESCRIPTION OF THE PREFERRED EMBODIMENTS

Figure 3:
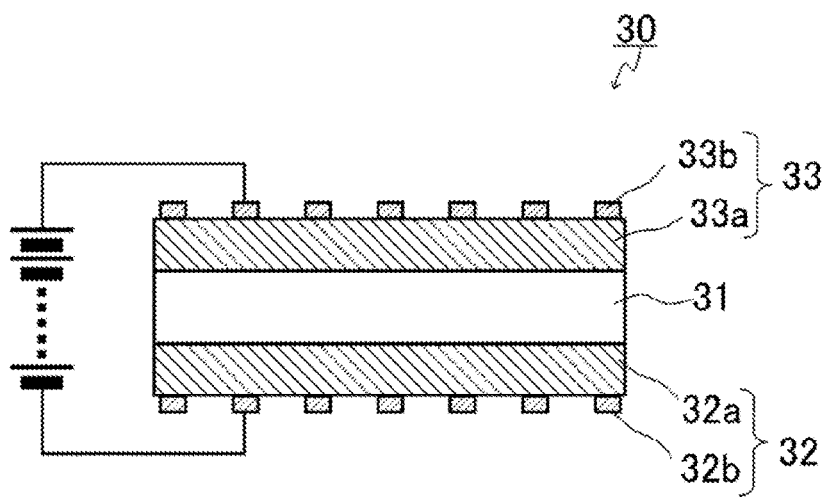
FIG. 3 is a cross-sectional view schematically illustrating an example of a conventional polymer actuator.
Figure 4:
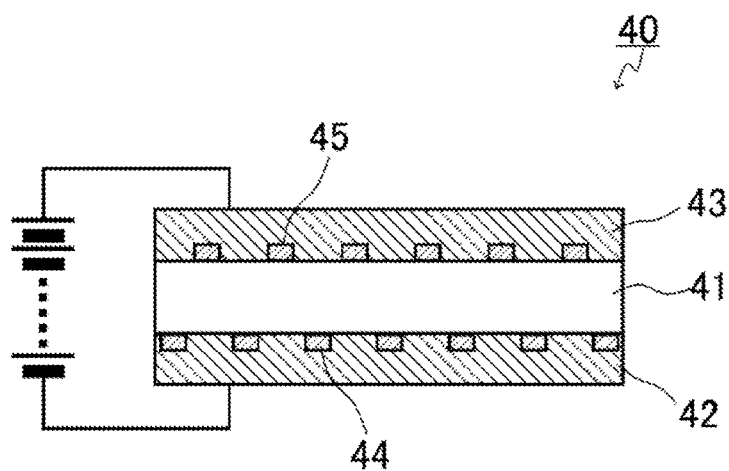
FIG. 4 is a cross-sectional view schematically illustrating an example of another conventional polymer actuator.

Preferred embodiments of the present invention will be described below with reference to the drawings. However, the present invention is not limited or restricted to the following examples of preferred embodiments of the present invention. It is to be noted that the drawings for reference below are schematically provided, and the dimensional ratios and other parameters of the elements shown in the drawings may differ from the dimensional ratios and other parameters of actual elements. The dimensional ratios and other parameters of elements may also differ between the drawings.

FIG. 1 shows a cross-sectional view of an insulating base material 10 including a conductive pattern according to a preferred embodiment of the present invention. The insulating base material 10 including the conductive pattern may preferably be used as a polymer actuator, for example. The insulating base material 10 including the conductive pattern includes an insulating base material layer 11, metal layers 12, and conductive patterns 13. The metal layers 12 are provided on the insulating base material layer 11. The conductive patterns 13 are made of a conductive material, and provided on the metal layers 12.

Preferably, the metal layers 12 have a larger in-plane resistance value than the in-plane resistance value of the conductive patterns 13, the difference is about 0.1 MΩ or more between the in-plane resistance value of the metal layers and the in-plane resistance value of the conductive patterns, and the difference falls within the range of about 0.1 MΩ to about 100 MΩ. In addition, while the metal layers 12 have a smaller in-plane resistance value than the in-plane resistance value of the insulating base material layer 11, in the present preferred embodiment, the difference is preferably about 100 MΩ or less between the in-plane resistance values of the metal layers 12 and the insulating base material layer 11, and the difference more preferably falls within the range of about 0.1 MΩ to about 100 MΩ. In addition, the in-plane resistance value of the metal layers 12 preferably falls within the range of about 0.1 MΩ to about 100 MΩ, and more preferably within the range of about 10 MΩ to about 100 MΩ, for example. The metal layers 12 with the in-plane resistance value can be formed by reducing the thicknesses, for example.

The thickness of the metal layers 12 is preferably, for example, about 10 nm or less, and more preferably within the range of about 1 nm to about 10 nm. The formation of the thin metal layers 12 enables the metal layers 12 to follow deformations of the insulating base material layer 11 even when the insulating base material layer 11 is deformed, such as being bent, and thus, the metal layers 12 will not interfere with the deformations of the insulating base material layer 11. Further, the metal layers having a thickness of about 10 nm or less are less likely to have properties as a bulk, and thus, higher in electrical resistance. For example, when the surface resistance is measured with a tester, even when a metal that has an in-plane resistance value on the order of about 10 mΩ as a bulk, the in-plane resistance value a layer having a thickness of about 10 nm or less represents a value on the order of several tens of MΩ. Therefore, even when the conductive patterns 13, such as an organic conductive material, for example, are provided on the metal layers 12, the conductive patterns 13 are not electrically connected to each other. It is to be noted that the in-plane resistance in preferred embodiments of the present invention refers to a resistance measured by applying two probes from a tester to points that are about 10 mm apart in a plane.

The in-plane resistance value of the metal layers 12 is preferably a higher value. When the in-plane resistance value is higher, the conductive patterns 13 are prevented from being electrically connected to each other, while electrical conductivity is ensured in the thickness direction, because of the resistance value of the metal of the metal layers 12 as a resistance value in the thickness direction.

The metal layers 12 preferably include a metal selected from the group consisting of Al (aluminum), Cu (copper), Pt (platinum), Au (gold), Ni (nickel), or alloys thereof, for example. From these metals, layers can be formed by a method, such as sputtering on the insulating base material layer 11, for example. The thickness of the metal layers 12 refers to an average thickness, and the metal layers 12 are not limited to films, but examples of the layers also include discontinuous shapes. For example, in the formation of the metal layers 12 by sputtering, the thicknesses are controlled with a monitor, such as a liquid crystal display.

In a preferred embodiment of the present invention, the insulating base material layer 11 is only required to have an insulating property, and may be applied to functional films, including piezoelectric films and touch panel materials. For example, a polymer electrostrictive material may be used as a material for piezoelectric films. The polymer electrostrictive material is not particularly limited as long as the polymer material has a permanent dipole. Examples of the polymer electrostrictive material include PVDF (polyvinylidene fluoride), PVDF-based copolymers, for example, copolymers such as P(VDF-TrFE) and P(VDF-VF), and terpolymers such as P(VDF-TrFE-CFE), P(VDF-TrFE-CTFE), P(VDF-TrFE-CDFE), P(VDF-TrFE-HFA), P(VDF-TrFEHFP), and P(VDF-TrFE-VC). In this regard, P refers to poly, VDF refers to vinylidene fluoride, TrFE refers to trifluoroethylene, CFE refers to chlorofluoroethylene, CTFE refers to chlorotrifluoroethylene, CDFE refers to chlorodifluoroethylene, HFA refers to hexafluoroacetone, HFP refers to hexafluoropropylene, and VC refers to vinylchloride. Of the materials described above, P(VDF-TrFE-CFE) is particularly preferable because the application of a voltage provides large strain.

PET films, polyimide films, and other suitable films may be used as touch panel materials. The thickness of the insulating base material layer 11 can be appropriately set, for example, in a range of several μm to about 100 μm.

The conductive patterns 13 may be made of any appropriate conductive material as long as the patterns function as electrodes. Examples of the conductive material include: metal materials such as Ni (nickel), Pt (platinum), Pt—Pd (platinum-palladium alloy), Al (aluminum), Au (gold), and Au—Pd (gold-palladium alloy); and organic conductive materials such as PEDOT (polyethylenedioxythiophene), PPy (polypyrrole), and PANI (polyaniline). Among these materials, the organic conductive materials are preferred, because as compared to the metal materials, the organic conductive materials more easily follow deformations (movements) of the insulating base material layer 11, will not interfere with deformations of the insulating base material layer 11, and reduce the likelihood that the conductive patterns 13 will crack. In addition, electrodes can be formed from the organic conductive materials by a method, such as brush coating with a prepared ink, spray coating with a mask, or screen printing with an ink having a relatively high viscosity. The thicknesses of the conductive patterns 13 can be appropriately set depending on the conductive material used and other factors, for example, in the range of about 10 nm to about 10 μm.

In a preferred embodiment of the present invention, the conductive patterns 13 are provided on the metal layers 12. The metal layers 12 with the in-plane resistance value as described above have a small thickness, without any bulk metal, and thus, have asperity of several nm at the surface of the layer. This asperity increases the surface area, thus improving the adhesion between the metal layers 12 and the conductive material. In addition, the metal layers 12 which have a small thickness are more likely to follow deformations of the insulating base material layer 11, and less likely to be peeled from the insulating base material layer 11. Therefore, in the insulating base material 10 including the conductive patterns, the conductive patterns 13 are less likely to be peeled.

When the conductive material used for the conductive patterns 13 is an organic conductive material, material degradation may be problematic. The organic conductive materials may have degraded conductive properties caused by defective double bonds therein generated by external stimuli, such as ultraviolet, temperature, and oxidation. The reduced conductivity further causes heat generation, and other problems, thus accelerating degradation. In addition, the organic conductive materials, in particular, PEDOT, are less likely to adhere to insulating base material layer 11 because of the formation of colloidal particles. Therefore, preferably in the formation of the patterns, with the use of a binder, conductive particles are disposed in adhesive contact with the insulating base material layer 11, with the binder interposed therebetween. This disposition of the conductive particles may be disturbed by deformations of the insulating base material layer 11, and in that case, the conductivity will be decreased, thus accelerating degradation. In a preferred embodiment of the present invention, the thin metal layers 12, which are intermittently arranged, connect the layers of the organic conductive material through the network, thus reducing the likelihood of the conductivity being decreased. As a result, the degradation of the conductive property as a whole is reduced or prevented.

Example 1

A film of PVDF-TrFE-CFE having a length of about 18 mm, a width of about 9 mm, and a thickness of about 10 μm was prepared as the insulating base material layer 11. The film can be obtained by a method in which a film material dissolved in a solvent is formed by a method, such as doctor blade on a PET (polyethylene terephthalate) film, and then peeled from the PET film. On this film, the metal layers 12 were formed using a roll-to-roll sputtering system. Al was used as the metal, and the metal layers had a thickness in the range of about 3 nm to about 5 nm.

On the film (insulating base material layer 11) with the metal layers 12 formed thereon, PEDOT as an organic conductive material was subjected to patterning by screen printing, and then dried at about 80° C. for about 5 minutes to form the conductive patterns 13a, 13b. In this manner, the insulating base material 10 including the conductive patterns was obtained. In the PEDOT patterning, with the use of, as a binder, a monomer containing an amide group and an acrylic monomer or a vinyl monomer, an ink including PEDOT and the binder was prepared for the screen printing.

The in-plane resistance value of the metal layer 12 was about 10 MΩ, whereas the in-plane resistance value of the conductive pattern was in a range of about 10 MΩ to about 100 MΩ, and the difference between the resistance values was about 10 MΩ.

The obtained insulating base material 10 including the conductive patterns was used to prepare an actuator 20. The actuator 20 includes the insulating base material 10 including the conductive patterns, and a flexible base material 21, and the insulating base material 10 with the conductive patterns is adhesively attached to the flexible base material 21. As the flexible base material 21, a PET film having a length of about 20 mm, a width of about 10 mm, and a thickness of about 100 μm was used.

FIGS. 2A and 2B show diagrams to explain the operation of the actuator. FIG. 2A shows the actuator which is not deformed, and FIG. 2B shows the actuator which is deformed. In the actuator 20, the conductive patterns 13a, 13b of the insulating base material 10 can be used as electrodes. Leading wires 23a, 23b that apply voltages are connected to the electrodes (conductive patterns 13a, 13b). A flexible base material end 21a is fixed to a fixed flat surface 22, to function as a fulcrum point of force. On the other hand, the other end 21b of the flexible base material 10 functions as an application point of force.

When a voltage of about 1000 V is applied to the leading wires, the voltage is applied to the electrodes (conductive patterns 13a, 13b). The voltage is almost constant within the electrodes, and an electric field is generated between the opposed electrodes. The PVDF-TrFE-CFE as an electrostrictive material contracts in the electrode direction, and extends in a direction perpendicular or substantially perpendicular to the direction of the electrodes opposed. However, the movement of the electrodes 13a is constrained by the flexible base material 21, which results in a bending deformation of the flexible base material 21 in one direction. In the present example, the displacement x of the end achieved a large displacement of about 10 mm.

As described above, even when the insulating base material layer 11 is warped or substantially warped by the application of an electric field, the metal layers 12 are less likely to be peeled, because the metal layers 12 are sandwiched between the organic conductive material (conductive patterns 13) and the insulating base material layer 11. The organic conductive material includes conductive particles disposed in adhesive contact with the base material to be subjected to pattern formation, with the adhesive binder interposed therebetween. When the surface of the base material has surface asperity formed by the metal layers on the order of several nm in thickness, the increased surface area increases the adhesion.

In addition, the electrostrictive material typically warps on the order of about 2% in an electric field of about 80

V/μm. The metal layers having a low resistance value so as to function as typical electrodes have an elastic limit of about 0.5% or less, and thus may fail to follow the deformations, thus inhibiting the deformations of the film, or increasing the likelihood that the metal layers will crack. On the other hand, when the metal layers have a thickness of about 10 nm or as in the present example, the metal is merely intermittently arranged in the metal layers, and the layers are, thus, easily deformed. Therefore, the application of an electric field does not interfere with the deformations of the film. The use of the insulating base material including the conductive patterns increases the reliability of the electrode portion in the actuator, thus enabling the actuator to be driven for a long period of time.

It is to be noted that in the formation of the metal layers 12 and the conductive patters 13a, 13b, one side of the film (insulating base material layer 11) may be subjected to sputtering and patterning to produce the conductive patterns, and the other side of the film may be further subjected to sputtering and patterning, or alternatively, both sides of the film (insulating base material layer 11) may be first subjected to sputtering, and then, for each side, subjected to the patterning.

In addition, the flexible base material 21 may be made of any appropriate flexible material, as long as the curvature follows the deformations of the insulating base material 10 including the conductive patterns. Examples of the flexible material include, in addition to PET, cellophane, vinyl chloride, polyimide, and polyester. In addition, the base material 21 may be made of an electrostrictive material. The thickness of the flexible base material 21 may preferably be appropriately set, for example, to be in the range of several μm to about 100 μm.

The insulating base material including the conductive pattern according to preferred embodiments of the present invention may be applied to various application uses. For example, the material can be used for various types of applications, such as touch panels, in addition to the actuator according to a preferred embodiment of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An insulating base material including a conductive pattern comprising:
    an insulating base material layer;
    a metal layer provided on the insulating base material layer; and
    a conductive pattern including a conductive material, and provided on the metal layer; wherein
    the metal layer has an in-plane resistance value that is at least about 0.1 MΩ larger than an in-plane resistance value of the conductive pattern; and
    a thickness of the metal layer is less than a thickness of the conductive pattern including the conductive material.

2. The insulating base material including the conductive pattern according to claim 1, wherein a difference between the in-plane resistance value of the metal layer and an in-plane resistance value of the insulating base material layer is about 100 MΩ or less.

3. The insulating base material including the conductive pattern according to claim 1, wherein the in-plane resistance value of the metal layer falls within a range of about 0.1 MΩ to about 100 MΩ.

4. The insulating base material including the conductive pattern according to claim 1, wherein the thickness of the metal layer is about 10 nm or less.

5. The insulating base material including the conductive pattern according to claim 1, wherein the insulating base material layer is an electrostrictive material.

6. The insulating base material including the conductive pattern according to claim 1, wherein the metal layer includes a metal selected from the group consisting of aluminum, copper, platinum, gold, nickel, or alloys thereof.

7. The insulating base material including the conductive pattern according to claim 1, wherein the conductive material is an organic conductive material.

8. The insulating base material including the conductive pattern according to claim 1, wherein the thickness of the metal layer is in a range of about 1 nm to about 10 nm.

9. The insulating base material including the conductive pattern according to claim 1, wherein the insulating base material layer includes a polymer electrostrictive material.

10. The insulating base material including the conductive pattern according to claim 9, wherein the polymer electrostrictive material is selective from the group consisting of polyvinylidene fluoride (PVDF), PVDF-based copolymers, and terpolymers.

11. The insulating base material including the conductive pattern according to claim 9, wherein the polymer electrostrictive material is P(VDF-TrFE-CFE), where P refers to poly, VDF refers to vinylidene fluoride, TrFE refers to trifluoroethylene, CFE refers to chlorofluoroethylene.

12. The insulating base material including the conductive pattern according to claim 1, wherein the conductive material includes at least one of nickel, platinum, platinum-palladium alloy, aluminum, gold, gold-palladium alloy, polyethylenedioxythiophene, polypyrrole, and polyaniline.

13. The insulating base material including the conductive pattern according to claim 1, wherein the in-plane resistance value of the metal layer falls within a range of about 10 MΩ to about 100 MΩ.

14. An actuator comprising:
    the insulating base material including the conductive pattern according to claim 1.

* * * * *